(12) United States Patent
Buchanan et al.

(10) Patent No.: US 7,199,474 B2
(45) Date of Patent: Apr. 3, 2007

(54) DAMASCENE STRUCTURE WITH INTEGRAL ETCH STOP LAYER

(75) Inventors: Keith Edward Buchanan, Trellech (GB); Joon-Chai Yeoh, Blackwood (GB)

(73) Assignee: Aviza Europe Limited, Gwent (GB)

( * ) Notice: Subject to any disclaimer, the term of this patent is extended or adjusted under 35 U.S.C. 154(b) by 232 days.

(21) Appl. No.: 10/484,168

(22) PCT Filed: Jul. 15, 2002

(86) PCT No.: PCT/GB02/03208

§ 371 (c)(1), (2), (4) Date: Jun. 18, 2004

(87) PCT Pub. No.: WO03/009341

PCT Pub. Date: Jan. 30, 2003

(65) Prior Publication Data

US 2004/0219794 A1    Nov. 4, 2004

(30) Foreign Application Priority Data

Jul. 19, 2001    (GB)    .................... 0117600.7

(51) Int. Cl.
*H01L 23/48*    (2006.01)

(52) U.S. Cl. ..................................... 257/760; 257/750
(58) Field of Classification Search .............. 257/750, 257/760
See application file for complete search history.

(56) References Cited

U.S. PATENT DOCUMENTS

| | | | |
|---|---|---|---|
| 6,720,247 B2* | 4/2004 | Kirkpatrick et al. | 438/622 |
| 6,962,869 B1* | 11/2005 | Bao et al. | 438/623 |
| 7,001,848 B1* | 2/2006 | Smith et al. | 438/725 |
| 2002/0055275 A1* | 5/2002 | MacNeil | 438/798 |

FOREIGN PATENT DOCUMENTS

| | | |
|---|---|---|
| EP | 1 059 664 A2 | 12/2000 |
| GB | 2 361 808 A | 10/2001 |
| WO | WO 00/51174 | 8/2000 |
| WO | WO 01/01472 A1 | 1/2001 |

\* cited by examiner

*Primary Examiner*—Doug Menz
(74) *Attorney, Agent, or Firm*—Volentine & Whitt, PLLC

(57) ABSTRACT

This invention relates to a semiconductor structure for dual damascene processing and includes upper and lower low k dielectric layers formed in a stack when the upper surface of the lower layer has an integral etch stop layer formed by exposing the upper surfaces of the layer $H_2$ plasma without any prior anneal prior to the deposition of the upper layer.

4 Claims, 2 Drawing Sheets

DAMASCENE STRUCTURE WITH INTEGRAL ETCH STOP LAYER

This invention relates to a semiconductor structure for dual damascene processing.

Damascene processing is becoming particularly important in the formation of semiconductor devices, because it is the method which is most suited to the deposition of copper. In order to perform damascene processing it is necessary to etch different, but overlapping, structures into stacked layers of dielectric by successive etch processes and this is best achieved when it is possible to detect when the etch has reached the boundary between two layers in a stack. In order for this stage to be detected, it is typical to form an etch stop layer at the boundary and this is typically done by depositing a thin layer of silicon nitride or carbide between the two dielectric layers. These materials have relatively high dielectric constants and add both to the thickness of the device and the dielectric constant of the dielectric stack.

The present invention consists in a semiconductor structure suitable for dual damascene processing including upper and lower low dielectric constant (k) dielectric layers formed in a stack wherein the upper surface of the lower layer has an integral etch stop layer formed by exposing the upper surface of the layer to $H_2$ plasma without any prior anneal, prior to the deposition of the upper layer.

The material of at least the lower dielectric layer may be of a SiCHO type material and may for example be formed by reacting tetramethylsilane and oxygen.

It is preferred that the etch stop layer is less than 1000 Å thick and is formed coincidentally with the lower dielectric layer and thus not consuming any additional process resources of time, materials or equipment over that required to fully form the dielectric layer.

From another aspect the invention consists in a method of etching dielectric layers including utilizing a surface layer formed by $H_2$ plasma treatment of a SiCHO type material low k dielectric as an etch stop layer.

The etching may form part of a dual damascene process.

Although the invention has been defined above it is to be understood it includes any inventive combination of the features set out above or in the following description.

The invention may be performed in various ways and will now be described, by way of example, with reference to the accompanying drawings, in which.

Figure 1:
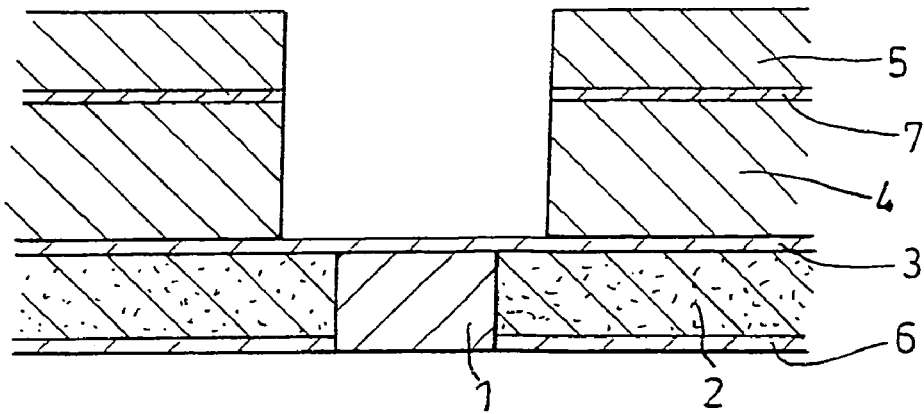
FIG. 1 is a scrap cross-section showing the prior art arrangement for dual damascene processing.

In FIG. 1 a dual damascene structure has been etched on a semi-conducting or insulating wafer. Thus a metalised via at 1 is bordered by a low dielectric constant insulating layer 2 having an etch stop layer 3 on its surface. This stop layer has the function of providing a stop for a trench etch process. The etch stop layer is then subsequently sputter etched removed from the top of the metal in the via to allow subsequent metal in the trench to contact it. The trench has been etched in a low dielectric constant insulator 4 using a mask 5. Typically layers 2 and 4 are essentially the same materials and are frequently bounded by other layers such as barrier layer 6 and capping layer 7.

Figure 2:
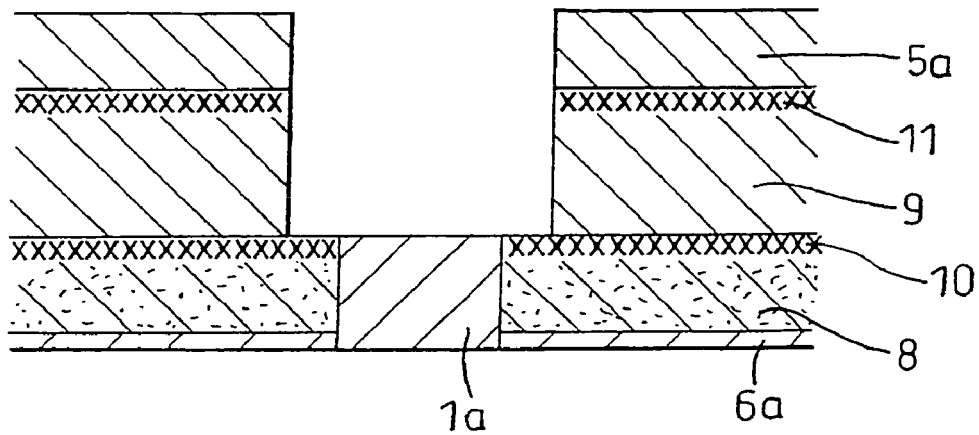
FIG. 2 is an equivalent view illustrating the process of the invention.

One example of the invention is illustrated in FIG. 2. A via filled with a metal or organic plug 1a formed in a low dielectric constant insulating layer 8 may be present—though not necessarily so. The precise sequence of when the via is etched and filled with metal is not important to the need for an etch stop layer for the formation of the overlying trench. This layer may have a barrier layer 6a. A second dielectric layer 9 is provided as in the prior art as is a mask 5a.

Figure 4:
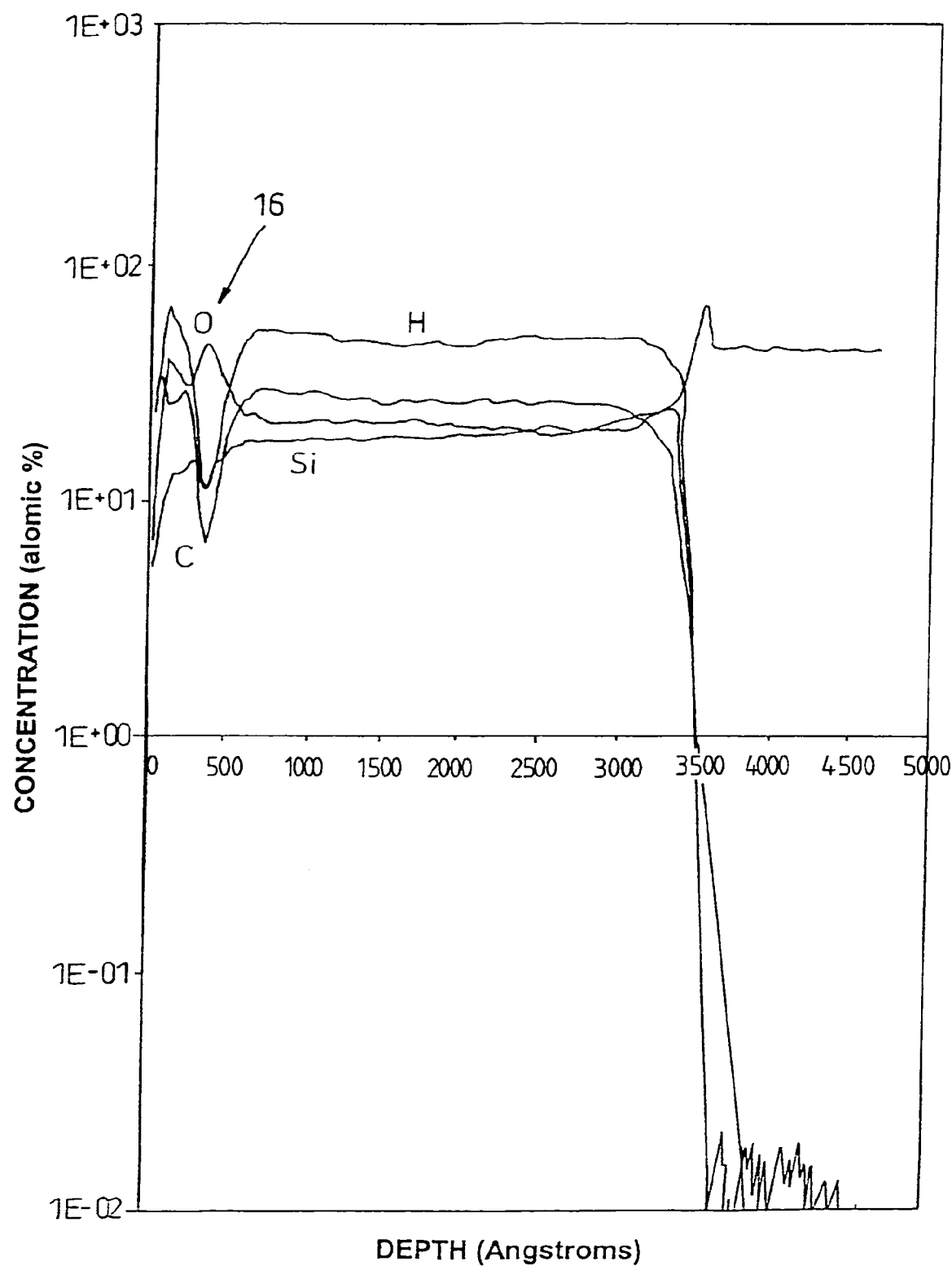
FIG. 4 is a SIM profile for a TMS and $O_2$ deposited film which has been set with a 5 minute $H_2$ plasma.

In the applicant's international Patent Application WO 01/01472, which is incorporated herein by reference, a method of forming a low k dielectric material by reacting tetramethylsilane and oxygen and subsequently treating it with $H_2$ plasma is described. In FIG. 19 of that document, which is hereby reproduced as FIG. 4, it was shown that such a film had a surface layer which was chemically different to the bulk of the layer. At the time, the applicants assumed that they would remove that layer so as to achieve a consistent dielectric material, but in any event that, for dual damascene and related processes, they would have to provide the conventional etch stop layer. The applicants have now determined that this surface layer or crust can be utilized as an etch stop layer. Thus in FIG. 2 the crust portion, which is indicated at 16, in FIG. 4, forms the integral etch stop layer 10 for dielectric layer 8 and can indeed constitute a capping layer 11 for the dielectric constant layer 9.

A typical treatment to create such an etch stop layer would be a hydrogen plasma treatment consisting in a 400° C. platen, 4 torr pressure, 1000 sccm of $H_2$ and 1 kw applied at 13.56 MHz to an upper showerhead electrode. Typically pure hydrogen has been used but hydrogen mixed with inert carrier gases or hydrogen containing gases may be suitable.

Figure 3:
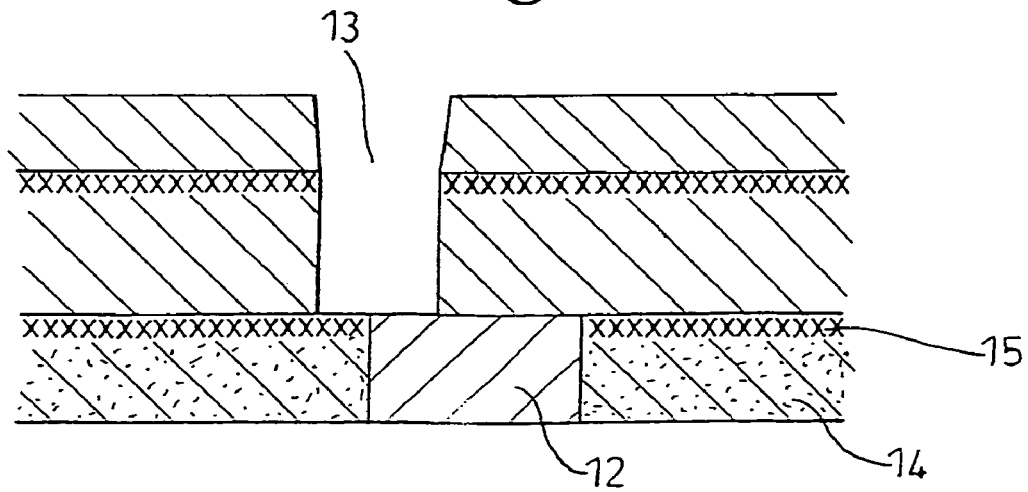
FIG. 3 is a view corresponding to FIG. 2, but wherein the etch elements have become partially offset.

Whilst trench etch has been described here, via etching onto a trench may also be improved by a surface layer of the invention, for example if the via mask is mis-aligned as illustrated in FIG. 3. In this case a metalised trench 12 has a via 13 etched to make a contact. If properly aligned and bordered this via etch would terminate on the trench metal completely, but if it is mis-aligned the via etch will need to terminate on a mix of trench metal and trench insulating layer 14. It can readily be seen that if a surface modification of the trench insulating layer upper surface 15 has been carried out to form an integral etch stop surface then the via etch will be improved. Thus the surface modification of the trench insulating layer will assist in via etches tolerating mis-alignment of the via mask and thus increase wafer yields.

The invention claimed is:

1. A semiconductor structure suitable for damascene processing including upper and lower k dielectric layers formed in a stack wherein the upper surface of the lower layer has an integral etch stop layer formed by exposing the upper surface of the layer to $H_2$ plasma without any prior anneal prior to the deposition of the upper layer.

2. A structure as claimed in claim 1 wherein the material of at least the lower dielectric layer is a SiCHO type material.

3. A structure as claimed in claim 1 wherein the material of at least the lower layer is formed by reacting tetramethylsilane and oxygen.

4. A structure as claimed in claim 1 wherein the layer is less than 1000 Å thick.

* * * * *